United States Patent
Han et al.

(10) Patent No.: US 9,768,203 B2
(45) Date of Patent: Sep. 19, 2017

(54) TFT ARRANGEMENT STRUCTURE COMPRISING STACKED DUAL TFT'S

(71) Applicant: Shenzhen China Star Optoelectronics Technology Co., Ltd., Shenzhen (CN)

(72) Inventors: Baixiang Han, Shenzhen (CN); Longqiang Shi, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 14/770,089

(22) PCT Filed: May 22, 2015

(86) PCT No.: PCT/CN2015/079537
§ 371 (c)(1),
(2) Date: Aug. 25, 2015

(87) PCT Pub. No.: WO2016/165189
PCT Pub. Date: Oct. 20, 2016

(65) Prior Publication Data
US 2016/0315104 A1    Oct. 27, 2016

(30) Foreign Application Priority Data
Apr. 14, 2015  (CN) .......................... 2015 1 0175497

(51) Int. Cl.
*H01L 29/10* (2006.01)
*H01L 27/12* (2006.01)
*H01L 29/22* (2006.01)

(52) U.S. Cl.
CPC ........ *H01L 27/1251* (2013.01); *H01L 27/124* (2013.01); *H01L 27/1222* (2013.01); *H01L 29/22* (2013.01); *H01L 27/1225* (2013.01)

(58) Field of Classification Search
CPC ........................ H01L 27/1251; H01L 27/1222
(Continued)

(56) References Cited

U.S. PATENT DOCUMENTS

6,512,504 B1 *  1/2003  Yamauchi ........... H01L 27/1251
                                                 257/E21.413
6,855,954 B1 *  2/2005  Zhang ................. H01L 27/1214
                                                 257/57
(Continued)

Primary Examiner — Caleb Henry
(74) Attorney, Agent, or Firm — Leong C. Lei (57) ABSTRACT

The present invention provides a TFT arrangement structure, comprising a first thin film transistor (T1) and a second thin film transistor (T2) controlled by the same control signal line; the first active layer (SC1) of the first thin film transistor (T1) and the second active layer (SC2) of the second thin film transistor (T2) are at different layers, and positioned to stack up in space, and the first source (S1) and the first drain (D1) of the first thin film transistor (T1) contact the first active layer (SC1), and the second source (S2) and the second drain (D2) of the second thin film transistor (T2) contact the second active layer (SC2); the bottom gate layer (Bottom Gate) of the first thin film transistor (T1) is positioned under the first active layer (SC1), and the top gate layer (Top Gate) of the second thin film transistor (T2) is above the second active layer (SC2). The TFT arrangement structure can reduce the space of the circuit arrangement to increase the flexibility of the circuit arrangement and satisfy the demands of the narrow frame and high resolution to the display panel.

12 Claims, 4 Drawing Sheets (58) Field of Classification Search
USPC .......................................................... 257/43
See application file for complete search history.

(56) References Cited

U.S. PATENT DOCUMENTS

| | | | | |
|---|---|---|---|---|
| 8,674,470 B1* | 3/2014 | Or-Bach | ............. | H01L 25/0657 257/499 |
| 8,803,206 B1* | 8/2014 | Or-Bach | ............. | H01L 27/098 257/278 |
| 2001/0030324 A1* | 10/2001 | Morikawa | ......... | H01L 27/14609 257/59 |
| 2009/0160741 A1* | 6/2009 | Inoue | ................... | G09G 3/3233 345/76 |
| 2010/0059747 A1* | 3/2010 | Nakayama | ........ | H01L 29/78696 257/43 |
| 2010/0110048 A1* | 5/2010 | Min | .................... | H01L 27/3253 345/204 |
| 2010/0155730 A1* | 6/2010 | Hong | ................. | H01L 27/1225 257/59 |
| 2010/0201664 A1* | 8/2010 | Lee | ....................... | B82Y 10/00 345/207 |
| 2011/0042668 A1* | 2/2011 | Hama | ................. | H01L 29/7869 257/43 |
| 2012/0146043 A1* | 6/2012 | Kitakado | ............ | G02F 1/13624 257/72 |
| 2013/0082914 A1* | 4/2013 | Matsumura | ....... | G02F 1/136209 345/92 |
| 2013/0146866 A1* | 6/2013 | Kitagawa | ............ | H01L 27/1225 257/43 |
| 2014/0145199 A1* | 5/2014 | Shi | ...................... | H01L 29/4908 257/72 |
| 2014/0197412 A1* | 7/2014 | Nishimura | .......... | G02F 1/13338 257/57 |
| 2015/0144952 A1* | 5/2015 | Kim | ................... | H01L 27/3262 257/72 |
| 2015/0280008 A1* | 10/2015 | Sun | ................... | H01L 29/78645 257/72 |
| 2015/0325705 A1* | 11/2015 | Choi | ................. | G02F 1/134363 257/72 |
| 2016/0093643 A1* | 3/2016 | Jang | .................. | H01L 29/78648 257/43 |
| 2016/0139471 A1* | 5/2016 | Matsumura | ....... | G02F 1/136209 349/43 |
| 2016/0247851 A1* | 8/2016 | Baba | .................. | H01L 27/1462 |

\* cited by examiner

TFT ARRANGEMENT STRUCTURE COMPRISING STACKED DUAL TFT'S

FIELD OF THE INVENTION

The present invention relates to a display technology field, and more particularly to a TFT arrangement structure.

BACKGROUND OF THE INVENTION

A flat panel display possesses advantages of being ultra thin, power saved and radiation free and has been widely utilized. The present flat panel display devices at present mainly comprise the Liquid Crystal Display (LCD) and the Organic Light Emitting Display (OLED).

Thin Film transistors (TFT) are important components of a flat panel display device. The TFTs can be formed on a glass substrate and a plastic substrate and generally employed as switch elements and driving elements utilized such as flat panel displays, LCDs, OLEDs and et cetera. As regarding of LCD, the Active Matrix Liquid Crystal Display utilizes GOA (Gate Drive On Array) circuit constructed with a plurality of TFTs is required to integrate the gate driver (Gate Drive IC) on the thin film transistor array substrate to achieve the scan line by line for driving the liquid crystal panel. For the Active Matrix OLED (AMOLED), the pixel compensation circuit constructed with a plurality of TFTs is required to implement compensation to the threshold voltage of the drive thin film transistor to make the display brightness of the AMOLED even.

With the global competition of the display panel grows more bitter, the demands of all the display makers for the narrow frame, high resolution get higher and higher. Particularly, in the mobile display device field, the present display panel frame has been narrowed to be under 2 mm, and the Pixels Per Inch (PPI) has already reached up higher than 500. For the design of the display panel, the narrower frame means smaller GOA arrangement space. The higher PPI means a smaller sub pixel area. Under this circumstance that the process ability is unchanged, the circuit effective arrangement area gets smaller. Particularly for the AMOLED display panel, one sub pixel generally comprises 2-7 TFTs. Thus, the higher demand is proposed for the circuit arrangement.

Figure 1:
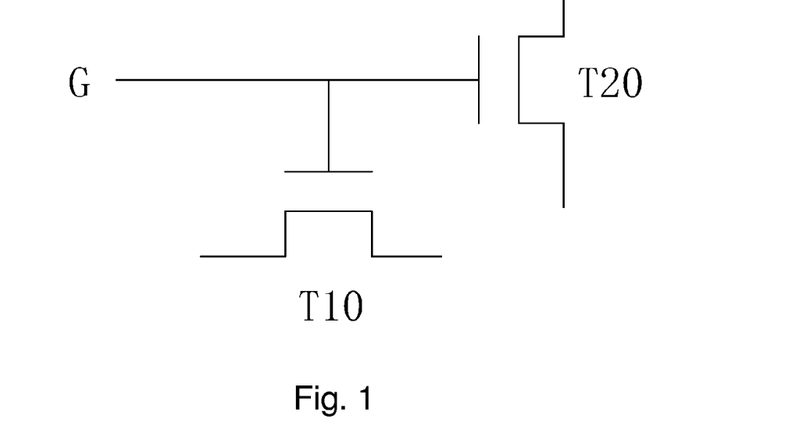
FIG. 1 is a circuit diagram of a TFT arrangement according to prior art.
Figure 2:
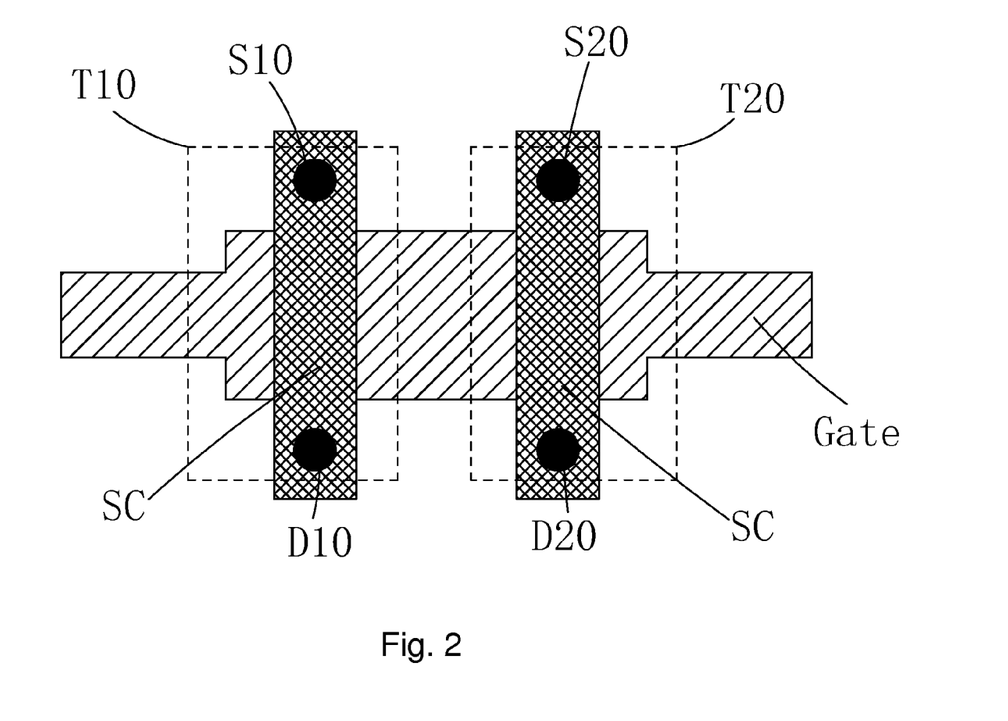
FIG. 2 is a TFT arrangement structure diagram of the circuit shown in FIG. 1.

The present GOA circuit and AMOLED pixel compensation circuit generally relate to the condition that one control signal line controls two TFTs. As shown in FIG. 1, both the gates of the first, second thin film transistors T10, T20 are electrically coupled to one control signal line G, i.e. both the first, second thin film transistors T10, T20 are controlled by the control signal line G; FIG. 2 is a TFT arrangement structure diagram of the circuit shown in FIG. 1. Both the source S10, the drain D10 of the first thin film transistor T10 are formed on the patterned active layer SC. Similarly, both the source S20, the drain D20 of the second thin film transistor T20 are formed on the patterned active layer SC. The same gate layer Gate coupled to the one control signal line controls the first, second thin film transistors T10, T20 at the same time. Because all the source S10, the drain D10 of the first thin film transistor T10 and the source S20, the drain D20 of the second thin film transistor T20 are formed on the patterned active layer SC. The first, second thin film transistors T10, T20 can only arranged in parallel and in interval along the pattern alignment direction of the active layer SC. The occupied arrangement space is larger, which goes against the development of the narrow frame and high resolution of the display panel.

SUMMARY OF THE INVENTION

An objective of the present invention is to provide a TFT arrangement structure, applicable to a GOA circuit and an AMOLED pixel compensation circuit and capable of reducing the space of the circuit arrangement in condition of ensuring the circuit function to increase the aperture ratio of the display panel and satisfying the demands of the narrow frame and high resolution to the display panel.

For realizing the aforesaid objective, the present invention provides a TFT arrangement structure, comprising a first thin film transistor and a second thin film transistor controlled by the same control signal line;

the first thin film transistor comprises a bottom gate layer, a first active layer, a first source and a first drain, and the second thin film transistor comprises a second active layer, a second source, a second drain and a top gate layer;

the first active layer and the second active layer are at different layers, and positioned to stack up in space, and the first source and the first drain contact the first active layer, and the second source and the second drain contact the second active layer;

the bottom gate layer is positioned under the first active layer, and the top gate layer is above the second active layer, and both the bottom gate layer and the top gate layer are electrically coupled to the control signal line to respectively control on and off of the first thin film transistor and the second thin film transistor.

The first active layer and the second active layer intersect with each other in space.

The TFT arrangement structure further comprises a substrate, a first insulation layer, a passivation layer and a second insulation layer; the first source, the first drain and the second source, the second drain are positioned at the same layer or at different layers.

The bottom gate layer is positioned on the substrate, and the first insulation layer is positioned on the bottom gate layer and the substrate, and the first active layer is positioned on the first insulation layer, and the passivation layer is positioned on the first active layer and the first insulation layer, and the first source and the first drain are positioned on the passivation layer and respectively contact two ends of the first active layer through passivation layer via holes, and the second active layer is positioned on the passivation layer, and the second source and the second drain are positioned on the passivation layer and respectively cover two ends of the second active layer, and the second insulation layer is positioned on the first source, the first drain, the second active layer, the second source, the second drain and the passivation layer, and the top gate layer is positioned on the second insulation layer.

The bottom gate layer is positioned on the substrate, and the first insulation layer is positioned on the bottom gate layer and the substrate, and the first active layer is positioned on the first insulation layer, and the first source and the first drain are positioned on the first insulation layer and respectively cover two ends of the first active layer, and the passivation layer is positioned on the first active layer, the first source, the first drain and the first insulation layer, and the second active layer is positioned on the passivation layer, and the second source and the second drain are positioned on the passivation layer and respectively cover two ends of the second active layer, and the second insulation layer is positioned on the second active layer, the second source, the second drain and the passivation layer, and the top gate layer is positioned on the second insulation layer.

Material of the bottom gate layer, the first source, the first drain, the second source, the second drain and the top gate layer is a stack combination of one or more of molybdenum, titanium, aluminum and copper.

Material of the first active layer and the second active layer is one of amorphous silicon based semiconductor, polysilicon based semiconductor and Zinc Oxide based semiconductor.

Material of the first insulation layer and the second insulation layer is Silicon Nitride, Silicon Oxide or a combination of the two.

The first active layer and the second active layer are both n-type semiconductor or both p-type semiconductor.

One of the first active layer and the second active layer is p-type semiconductor and the other is n-type semiconductor.

The present invention further provides a TFT arrangement structure, comprising a first thin film transistor and a second thin film transistor controlled by the same control signal line;

the first thin film transistor comprises a bottom gate layer, a first active layer, a first source and a first drain, and the second thin film transistor comprises a second active layer, a second source, a second drain and a top gate layer;

the first active layer and the second active layer are at different layers, and positioned to stack up in space, and the first source and the first drain contact the first active layer, and the second source and the second drain contact the second active layer;

the bottom gate layer is positioned under the first active layer, and the top gate layer is above the second active layer, and both the bottom gate layer and the top gate layer are electrically coupled to the control signal line to respectively control on and off of the first thin film transistor and the second thin film transistor;

wherein the first active layer and the second active layer intersect with each other in space;

the TFT arrangement structure further comprises a substrate, a first insulation layer, a passivation layer and a second insulation layer; the first source, the first drain and the second source, the second drain are positioned at the same layer or at different layers;

wherein the bottom gate layer is positioned on the substrate, and the first insulation layer is positioned on the bottom gate layer and the substrate, and the first active layer is positioned on the first insulation layer, and the passivation layer is positioned on the first active layer and the first insulation layer, and the first source and the first drain are positioned on the passivation layer and respectively contact two ends of the first active layer through passivation layer via holes, and the second active layer is positioned on the passivation layer, and the second source and the second drain are positioned on the passivation layer and respectively cover two ends of the second active layer, and the second insulation layer is positioned on the first source, the first drain, the second active layer, the second source, the second drain and the passivation layer, and the top gate layer is positioned on the second insulation layer;

wherein material of the bottom gate layer, the first source, the first drain, the second source, the second drain and the top gate layer is a stack combination of one or more of molybdenum, titanium, aluminum and copper;

wherein material of the first active layer and the second active layer is one of amorphous silicon based semiconductor, polysilicon based semiconductor and Zinc Oxide based semiconductor;

wherein material of the first insulation layer and the second insulation layer is Silicon Nitride, Silicon Oxide or a combination of the two.

The benefits of the present invention are: the present invention provides a TFT arrangement structure. the first thin film transistor and the second transistor controlled by the same control signal line respectively comprise the first active layer, the second active layer and the bottom gate, the top gate layer, and the first active layer and the second active layer are positioned at different layers to stack up in space, to make that the two TFTs are positioned to stack up in space. It is capable of reducing the space of the circuit arrangement in condition of ensuring the circuit function to increase the flexibility of the circuit arrangement and the aperture ratio of the display panel for satisfying the demands of the narrow frame and high resolution to the display panel and being applicable to a GOA circuit and an AMOLED pixel compensation circuit.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 3:
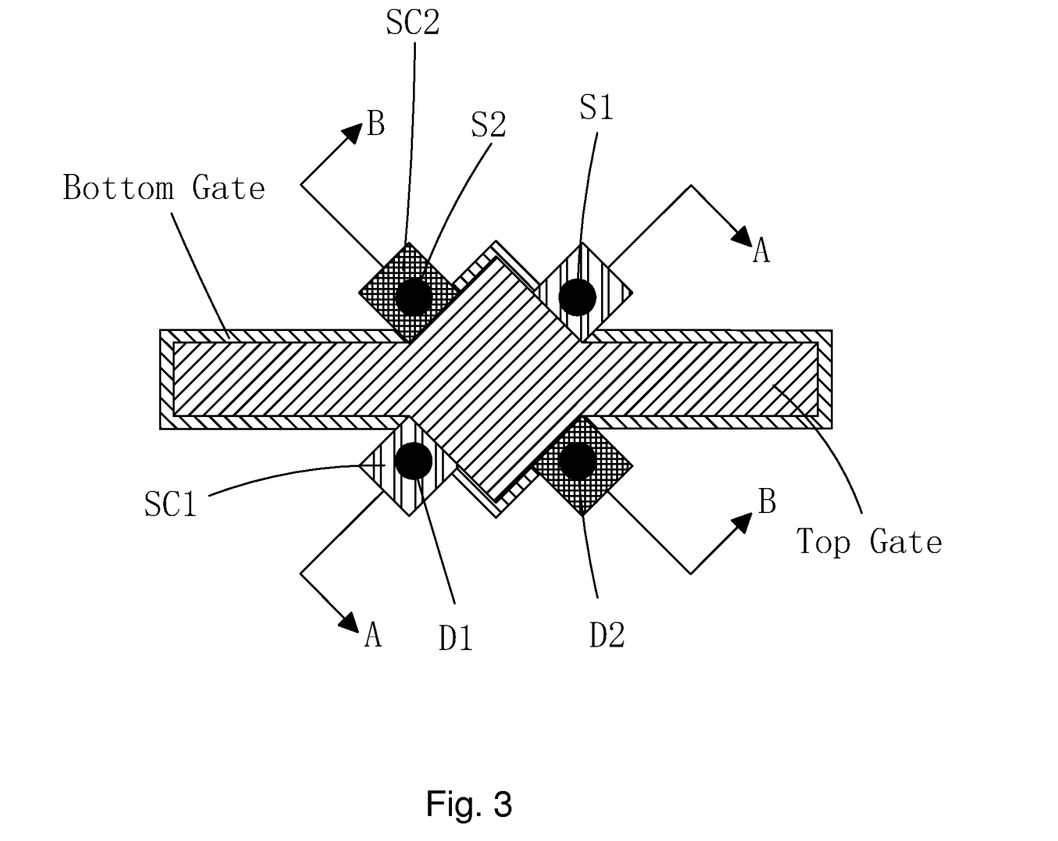
FIG. 3 is a top view diagram of the TFT arrangement structure according to the present invention.
Figure 4:
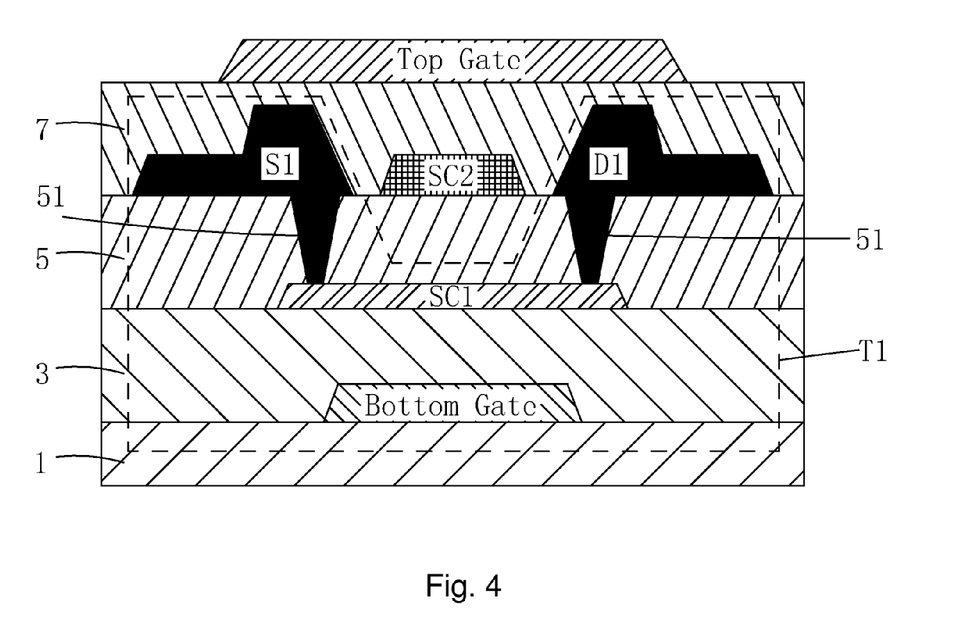
FIG. 4 shows one embodiment corresponding to A-A section diagram in FIG. 3.
Figure 6:
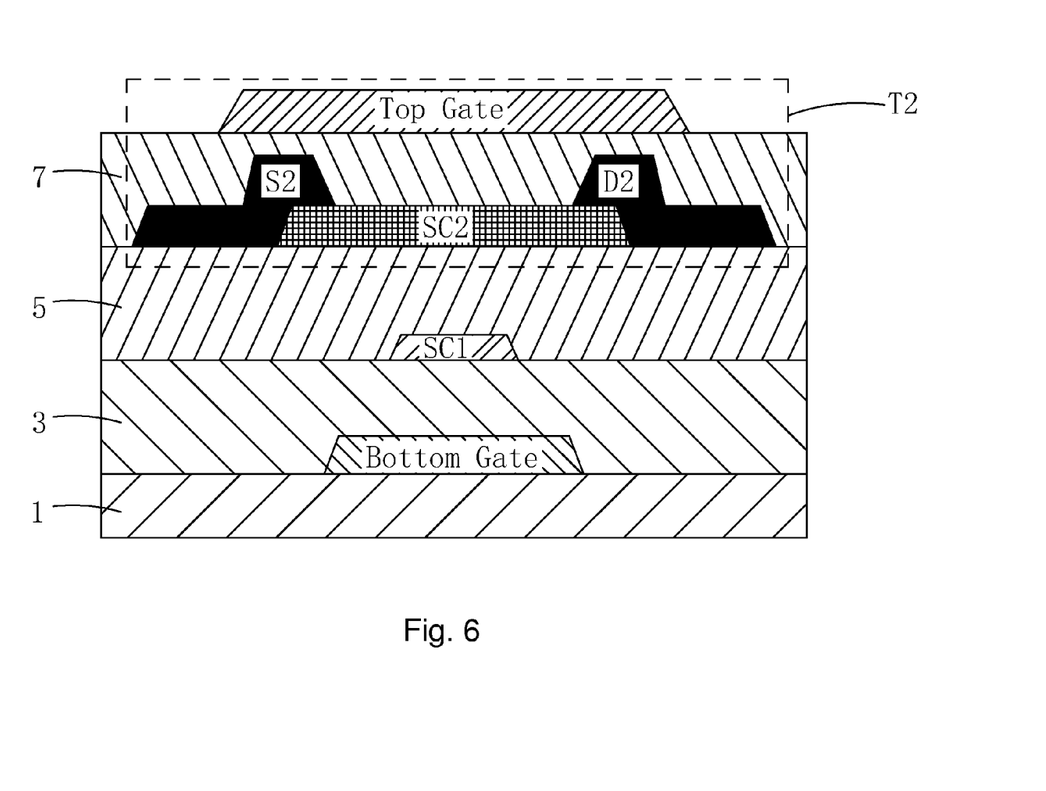
FIG. 6 is a sectional diagram corresponding to B-B section in FIG. 3.

Please refer to FIG. 3, FIG. 4 and FIG. 6. The present invention provides a TFT arrangement structure, comprising a first thin film transistor T1 and a second thin film transistor T2 controlled by the same control signal line.

The first thin film transistor T1 comprises a bottom gate layer Bottom Gate, a first active layer SC1, a first source S1 and a first drain D1, and the second thin film transistor T2 comprises a second active layer SC2, a second source S2, a second drain D2 and a top gate layer Top Gate.

The first active layer SC1 and the second active layer SC2 are at different layers, and positioned to stack up in space, and the first source S1 and the first drain D1 contact the first active layer SC1, and the second source S2 and the second drain D2 contact the second active layer SC2; the bottom gate layer Bottom Gate is positioned under the first active layer SC1, and the top gate layer Top Gate is above the second active layer SC2. Thus, the two TFTs, the first thin film transistor T1 and the second thin film transistor T2 are positioned to stack up in space.

Both the bottom gate layer Bottom Gate and the top gate layer Top Gate are electrically coupled to the control signal line to respectively control on and off of the first thin film transistor T1 and the second thin film transistor T2.

Figure 7:
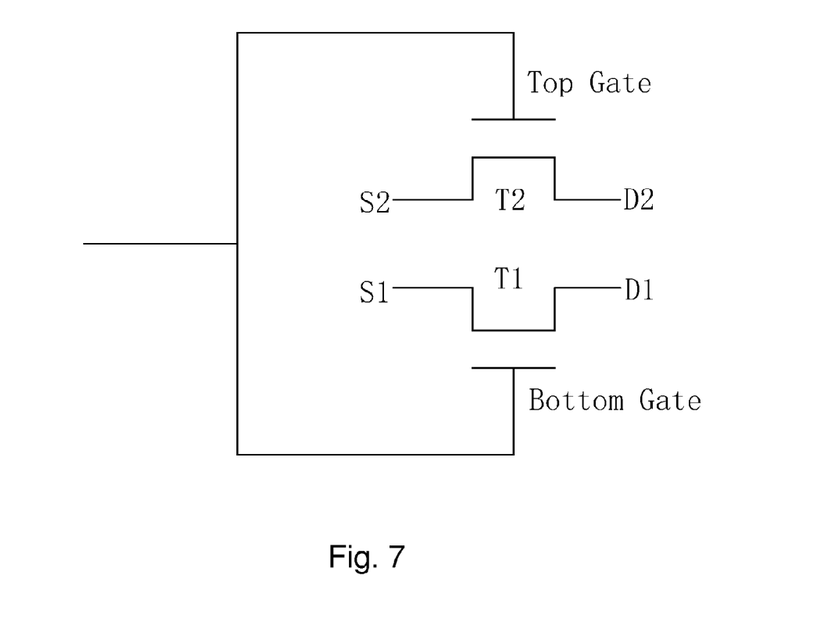
FIG. 7 is a circuit diagram corresponding to the TFT arrangement structure shown in FIG. 3.

As shown in FIG. 7, the TFT arrangement of the present invention achieves that the first thin film transistor T1 and the second thin film transistor T2 are positioned to stack up in space. In comparison with prior arts that the two TFTs which are controlled by the same control signal line are arranged in parallel and in interval along the pattern alignment direction of the active layer SC, the present invention can tremendously reduce the space of the circuit arrangement to increase the aperture ratio of the display panel for satisfying the demands of the narrow frame and high resolution to the display panel. Meanwhile, with the structure of the dual active layers, dual gate layers of the first active layer SC1, the second active layer SC2 and the bottom gate layer Bottom Gate, the top gate layer Top Gate, the flexibility of the circuit arrangement can be promoted.

Furthermore, as shown in FIG. 3, the first active layer SC1 and the second active layer SC2 intersect with each other in space for reducing the space of the circuit arrangement in advance and easily distinguishing a led out point of the first source S1 and the first drain D1 on the first active layer SC1 and a led out point of the second source S2 and the second drain D2 on the second active layer SC2.

Specifically, the TFT arrangement structure further comprises a substrate 1, a first insulation layer 3, a passivation layer 5 and a second insulation layer 7. As shown in FIG. 4, FIG. 6, the first source S1, the first drain D1 and the second source S2, the second drain D2 can be positioned at the same layer. The bottom gate layer Bottom Gate is positioned on the substrate 1; the first insulation layer 3 is positioned on the bottom gate layer Bottom Gate and the substrate 1; the first active layer SC1 is positioned on the first insulation layer 3; the passivation layer 5 is positioned on the first active layer SC1 and the first insulation layer 3; the first source S1 and the first drain D1 are positioned on the passivation layer 5 and respectively contact two ends of the first active layer SC1 through passivation layer via holes 51; the second active layer SC2 is positioned on the passivation layer 5; the second source S2 and the second drain D2 are positioned on the passivation layer 5 and respectively cover two ends of the second active layer SC2 to make the second source S2 and the second drain D2 to electrically contact the second active layer SC2, respectively; the second insulation layer 7 is positioned on the first source S1, the first drain D1, the second active layer SC2, the second source S2, the second drain D2 and the passivation layer 5; the top gate layer Top Gate is positioned on the second insulation layer 7. In this embodiment, all the first source S1, the first drain D1 and second source S2, the second drain D2 are positioned on the passivation layer 5.

Figure 5:
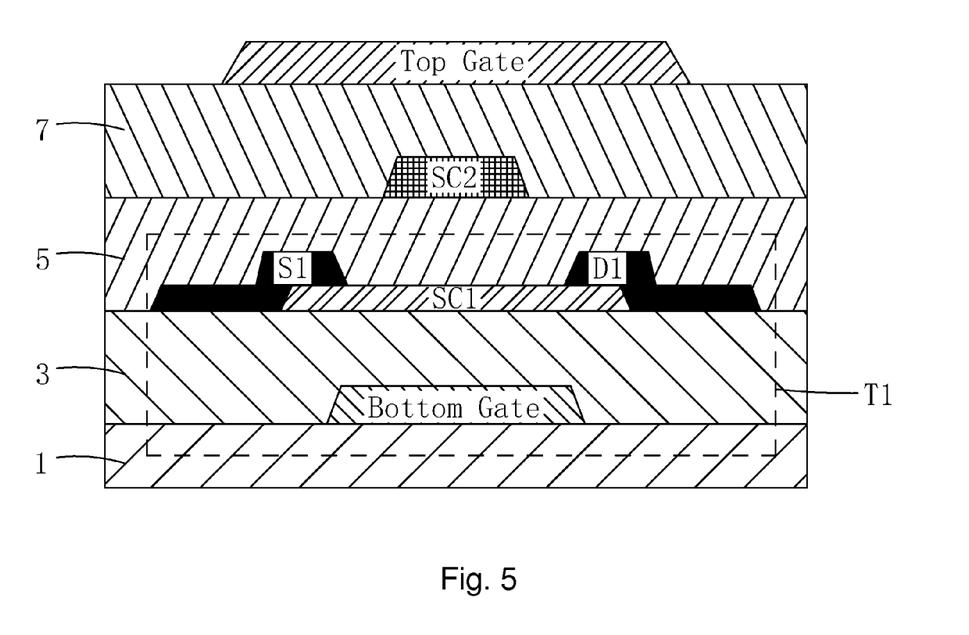
FIG. 5 shows another embodiment corresponding to A-A section diagram in FIG. 3.

Certainly, the first source S1, the first drain D1 and the second source S2, the second drain D2 can be at different layer. As shown in FIG. 5, FIG. 6, the bottom gate layer Bottom Gate is positioned on the substrate 1; the first insulation layer 3 is positioned on the bottom gate layer Bottom Gate and the substrate 1; the first active layer SC1 is positioned on the first insulation layer 3; the first source S1 and the first drain D1 are positioned on the first insulation layer 3 and respectively cover two ends of the first active layer SC1 to make the first source S1 and the first drain D1 to electrically contact the first active layer SC1, respectively; the passivation layer 5 is positioned on the first active layer SC1, the first source S1, the first drain D1 and the first insulation layer 3; the second active layer SC2 is positioned on the passivation layer 5; the second source S2 and the second drain D2 are positioned on the passivation layer 5 and respectively cover two ends of the second active layer SC2 to make the second source S2 and the second drain D2 to electrically contact the second active layer SC2, respectively; the second insulation layer 7 is positioned on the second active layer SC2, the second source S2, the second drain D2 and the passivation layer 5; the top gate layer Top Gate is positioned on the second insulation layer 7. In this embodiment, the first source S1, the first drain D1 are positioned on the first insulation layer 3, and second source S2, the second drain D2 are positioned on the passivation layer 5.

Selectably, the substrate 1 is a glass substrate or a plastic substrate.

Material of the bottom gate layer Bottom Gate, the first source S1, the first drain D1, the second source S2, the second drain D2 and the top gate layer Top Gate is a stack combination of one or more of molybdenum, titanium, aluminum and copper.

Material of the first active layer SC1 and the second active layer SC2 is one of amorphous silicon based semiconductor, polysilicon based semiconductor and Zinc Oxide based semiconductor.

The first active layer SC1 and the second active layer SC2 are both n-type semiconductor or both p-type semiconductor. Under such circumstance, the bottom gate layer Bottom Gate and the top gate layer Top Gate are controlled by the control signal line to make the first thin film transistor T1 and the second thin film transistor T2 to be on or off at the same time.

Alternatively, one of the first active layer SC1 and the second active layer SC2 is p-type semiconductor and the other is n-type semiconductor. Under such circumstance, the first thin film transistor T1 and the second thin film transistor T2 have contrary threshold voltages. The Bottom gate layer Bottom Gate and the top gate layer Top Gate are controlled by the control signal line. As the first thin film transistor T1 is on, the second thin film transistor T2 is off and as the first thin film transistor T1 is off, the second thin film transistor T2 is on.

Material of the first insulation layer 3 and the second insulation layer 7 is Silicon Nitride, Silicon Oxide or a combination of the two.

The aforesaid TFT arrangement structure is applicable to a GOA circuit and an AMOLED pixel compensation circuit and capable of reducing the space of the circuit arrangement in condition of ensuring the circuit function to increase the flexibility of the circuit arrangement and the aperture ratio of the display panel for satisfying the demands of the narrow frame and high resolution to the display panel.

In conclusion, the TFT arrangement structure of the present invention, the first thin film transistor and the second transistor controlled by the same control signal line respectively comprise the first active layer, the second active layer and the bottom gate, the top gate layer, and the first active layer and the second active layer are positioned at different layers to stack up in space, to make that the two TFTs are positioned to stack up in space. It is capable of reducing the space of the circuit arrangement in condition of ensuring the circuit function to increase the flexibility of the circuit arrangement and the aperture ratio of the display panel for satisfying the demands of the narrow frame and high resolution to the display panel and being applicable to a GOA circuit and an AMOLED pixel compensation circuit.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A thin-film transistor (TFT) arrangement structure, comprising a first thin film transistor and a second thin film transistor controlled by the same control signal line;
   wherein the first thin film transistor comprises a bottom gate layer, a first active layer, a first source and a first drain, and the second thin film transistor comprises a second active layer, a second source, a second drain and a top gate layer;
   the first active layer and the second active layer are at different layers, and positioned to stack up in a vertical direction in space, and the first source and the first drain contact the first active layer, and the second source and the second drain contact the second active layer; and
   the bottom gate layer is positioned under the first active layer in the vertical direction, and the top gate layer is above the second active layer in the vertical direction, and both the bottom gate layer and the top gate layer are electrically coupled to the control signal line to respectively control on and off of the first thin film transistor and the second thin film transistor;
   wherein the bottom gate layer and the top gate layer are separate and spaced from each other by the stack of the first active layer and the second active layer and are respectively located at opposite sides of the stack of the first active layer and the second active layer;
   wherein the first active layer of the first thin film transistor has a middle portion and two end portions extending from the middle portion along a first horizontal linear axis in opposite directions; the second active layer has a middle portion and two end portions extending from the middle portion along a second horizontal linear axis in opposite directions, wherein the first and second horizontal linear axes are angularly shifted away from each other about the vertical direction and are angularly spaced from each other;
   wherein the bottom gate layer of the first thin film transistor extends horizontally along a third horizontal linear axis that is angularly shifted away from the first horizontal linear axis about the vertical direction and is angularly spaced from the first horizontal linear axis; and the top gate layer of the second thin film transistor extends horizontally along a fourth horizontal linear axis that is angularly shifted away from the second horizontal linear axis about the vertical direction and is angularly spaced from the second horizontal linear axis, wherein the third and fourth horizontal linear axes are substantially coincident with each other and the third and fourth horizontal linear axes are angularly spaced from the first horizontal linear axis and are also angularly spaced from the second horizontal linear axis, such that the first horizontal linear axis, the second horizontal linear axis, and the third and fourth horizontal linear axes are angularly spaced from one another.

2. The TFT arrangement structure according to claim 1, further comprising a substrate, a first insulation layer, a passivation layer and a second insulation layer; the first source, the first drain and the second source, the second drain are positioned at the same layer or at different layers.

3. The TFT arrangement structure according to claim 2, wherein the bottom gate layer is positioned on the substrate, and the first insulation layer is positioned on the bottom gate layer and the substrate, and the first active layer is positioned on the first insulation layer, and the passivation layer is positioned on the first active layer and the first insulation layer, and the first source and the first drain are positioned on the passivation layer and respectively contact the two end portions of the first active layer through passivation layer via holes, and the second active layer is positioned on the passivation layer, and the second source and the second drain are positioned on the passivation layer and respectively cover the two end portions of the second active layer, and the second insulation layer is positioned on the first source, the first drain, the second active layer, the second source, the second drain and the passivation layer, and the top gate layer is positioned on the second insulation layer.

4. The TFT arrangement structure according to claim 2, wherein the bottom gate layer is positioned on the substrate, and the first insulation layer is positioned on the bottom gate layer and the substrate, and the first active layer is positioned on the first insulation layer, and the first source and the first drain are positioned on the first insulation layer and respectively cover the two end portions of the first active layer, and the passivation layer is positioned on the first active layer, the first source, the first drain and the first insulation layer, and the second active layer is positioned on the passivation layer, and the second source and the second drain are positioned on the passivation layer and respectively cover the two end portions of the second active layer, and the second insulation layer is positioned on the second active layer, the second source, the second drain and the passivation layer, and the top gate layer is positioned on the second insulation layer.

5. The TFT arrangement structure according to claim 2, wherein material of the bottom gate layer, the first source, the first drain, the second source, the second drain and the top gate layer is a stack combination of one or more of molybdenum, titanium, aluminum and copper.

6. The TFT arrangement structure according to claim 2, wherein material of the first active layer and the second active layer is one of amorphous silicon based semiconductor, polysilicon based semiconductor and Zinc Oxide based semiconductor.

7. The TFT arrangement structure according to claim 2, wherein material of the first insulation layer and the second insulation layer is Silicon Nitride, Silicon Oxide or a combination of the two.

8. The TFT arrangement structure according to claim 6, wherein the first active layer and the second active layer are both n-type semiconductor or both p-type semiconductor.

9. The TFT arrangement structure according to claim 6, wherein one of the first active layer and the second active layer is p-type semiconductor and the other is n-type semiconductor.

10. A thin-film transistor (TFT) arrangement structure, comprising a first thin film transistor and a second thin film transistor controlled by the same control signal line;
   the first thin film transistor comprises a bottom gate layer, a first active layer, a first source and a first drain, and the second thin film transistor comprises a second active layer, a second source, a second drain and a top gate layer;
   the first active layer and the second active layer are at different layers, and positioned to stack up in a vertical direction in space, and the first source and the first drain contact the first active layer, and the second source and the second drain contact the second active layer;

the bottom gate layer is positioned under the first active layer in the vertical direction, and the top gate layer is above the second active layer in the vertical direction, and both the bottom gate layer and the top gate layer are electrically coupled to the control signal line to respectively control on and off of the first thin film transistor and the second thin film transistor;

wherein the bottom gate layer and the top gate layer are separate and spaced from each other by the stack of the first active layer and the second active layer and are respectively located at opposite sides of the stack of the first active layer and the second active layer;

wherein the first active layer of the first thin film transistor has a middle portion and two end portions extending from the middle portion along a first horizontal linear axis in opposite directions; the second active layer has a middle portion and two end portions extending from the middle portion along a second horizontal linear axis in opposite directions, wherein the first and second horizontal linear axes are angularly shifted away from each other about the vertical direction and are angularly spaced from each other;

wherein the bottom gate layer of the first thin film transistor extends horizontally along a third horizontal linear axis that is angularly shifted away from the first horizontal linear axis about the vertical direction and is angularly spaced from the first horizontal linear axis; and the top gate layer of the second thin film transistor extends horizontally along a fourth horizontal linear axis that is angularly shifted away from the second horizontal linear axis about the vertical direction and is angularly spaced from the second horizontal linear axis, wherein the third and fourth horizontal linear axes are substantially coincident with each other and the third and fourth horizontal linear axes are angularly spaced from the first horizontal linear axis and are also angularly spaced from the second horizontal linear axis, such that the first horizontal linear axis, the second horizontal linear axis, and the third and fourth horizontal linear axes are angularly spaced from one another;

wherein the TFT arrangement structure further comprises a substrate, a first insulation layer, a passivation layer and a second insulation layer; the first source, the first drain and the second source, the second drain are positioned at the same layer or at different layers;

wherein the bottom gate layer is positioned on the substrate, and the first insulation layer is positioned on the bottom gate layer and the substrate, and the first active layer is positioned on the first insulation layer, and the passivation layer is positioned on the first active layer and the first insulation layer, and the first source and the first drain are positioned on the passivation layer and respectively contact the two end portions of the first active layer through passivation layer via holes, and the second active layer is positioned on the passivation layer, and the second source and the second drain are positioned on the passivation layer and respectively cover the two end portions of the second active layer, and the second insulation layer is positioned on the first source, the first drain, the second active layer, the second source, the second drain and the passivation layer, and the top gate layer is positioned on the second insulation layer;

wherein material of the bottom gate layer, the first source, the first drain, the second source, the second drain and the top gate layer is a stack combination of one or more of molybdenum, titanium, aluminum and copper;

wherein material of the first active layer and the second active layer is one of amorphous silicon based semiconductor, polysilicon based semiconductor and Zinc Oxide based semiconductor;

wherein material of the first insulation layer and the second insulation layer is Silicon Nitride, Silicon Oxide or a combination of the two.

11. The TFT arrangement structure according to claim 10, wherein the first active layer and the second active layer are both n-type semiconductor or both p-type semiconductor.

12. The TFT arrangement structure according to claim 10, wherein one of the first active layer and the second active layer is p-type semiconductor and the other is n-type semiconductor.

* * * * *